United States Patent [19]
Asano et al.

[11] Patent Number: 5,183,378
[45] Date of Patent: Feb. 2, 1993

[54] WAFER COUNTER HAVING DEVICE FOR ALIGNING WAFERS

[75] Inventors: Takanobu Asano, Yokohama; Katsumi Ishii, Kanagawa, both of Japan

[73] Assignee: Tokyo Electron Sagami Limited, Kanagawa, Japan

[21] Appl. No.: 672,852

[22] Filed: Mar. 20, 1991

[30] Foreign Application Priority Data

Mar. 20, 1990 [JP] Japan ................................. 2-71560
May 28, 1990 [JP] Japan ............................... 2-138020

[51] Int. Cl.$^5$ ............................................. B65G 47/24
[52] U.S. Cl. .................................... 414/757; 414/417; 414/433; 414/DIG. 2
[58] Field of Search ............... 414/331, 417, 431, 436, 414/437, 754, 757, DIG. 2; 198/394

[56] References Cited

U.S. PATENT DOCUMENTS

| | | | |
|---|---|---|---|
| 3,820,647 | 6/1974 | Waugh, Jr. et al. | 414/757 |
| 4,311,427 | 1/1982 | Coau et al. | 414/417 X |
| 4,566,841 | 1/1986 | Ohmura et al. | 414/417 |
| 4,806,057 | 2/1989 | Cay et al. | 414/433 |
| 4,813,840 | 3/1989 | Prabmaher et al. | 414/433 |
| 4,840,530 | 6/1989 | Nguyen | 414/417 X |
| 4,938,655 | 7/1990 | Asano | 414/417 X |
| 4,952,115 | 8/1990 | Ohkase | 414/417 X |
| 5,007,788 | 4/1991 | Asano et al. | 414/417 |

FOREIGN PATENT DOCUMENTS

| | | |
|---|---|---|
| 61-129340 | 8/1986 | Japan . |
| 63-13344 | 1/1988 | Japan . |
| 1-743 | 1/1989 | Japan . |
| 1-59739 | 12/1989 | Japan . |
| 8404739 | 12/1984 | World Int. Prop. O. ........... 414/433 |

*Primary Examiner*—David A. Bucci
*Attorney, Agent, or Firm*—Oblon, Spivak, McClelland, Maier & Neustadt

[57] ABSTRACT

A wafer counter device comprising a system for aligning the orientation flats of plural wafers in a cassette with one another and a system provided with optical sensors for detecting whether or not the wafers are present in the cassette and serving to count the number of the wafers in the cassette on the basis of the result detected by the optical sensors. The wafers aligning system includes aligning rollers contacted with the rims of the wafers to rotate the wafers, a system for lifting the aligning rollers in such a way that the rollers can be contacted with the rims of the wafers, and a motor for rotating the aligning rollers.

9 Claims, 7 Drawing Sheets

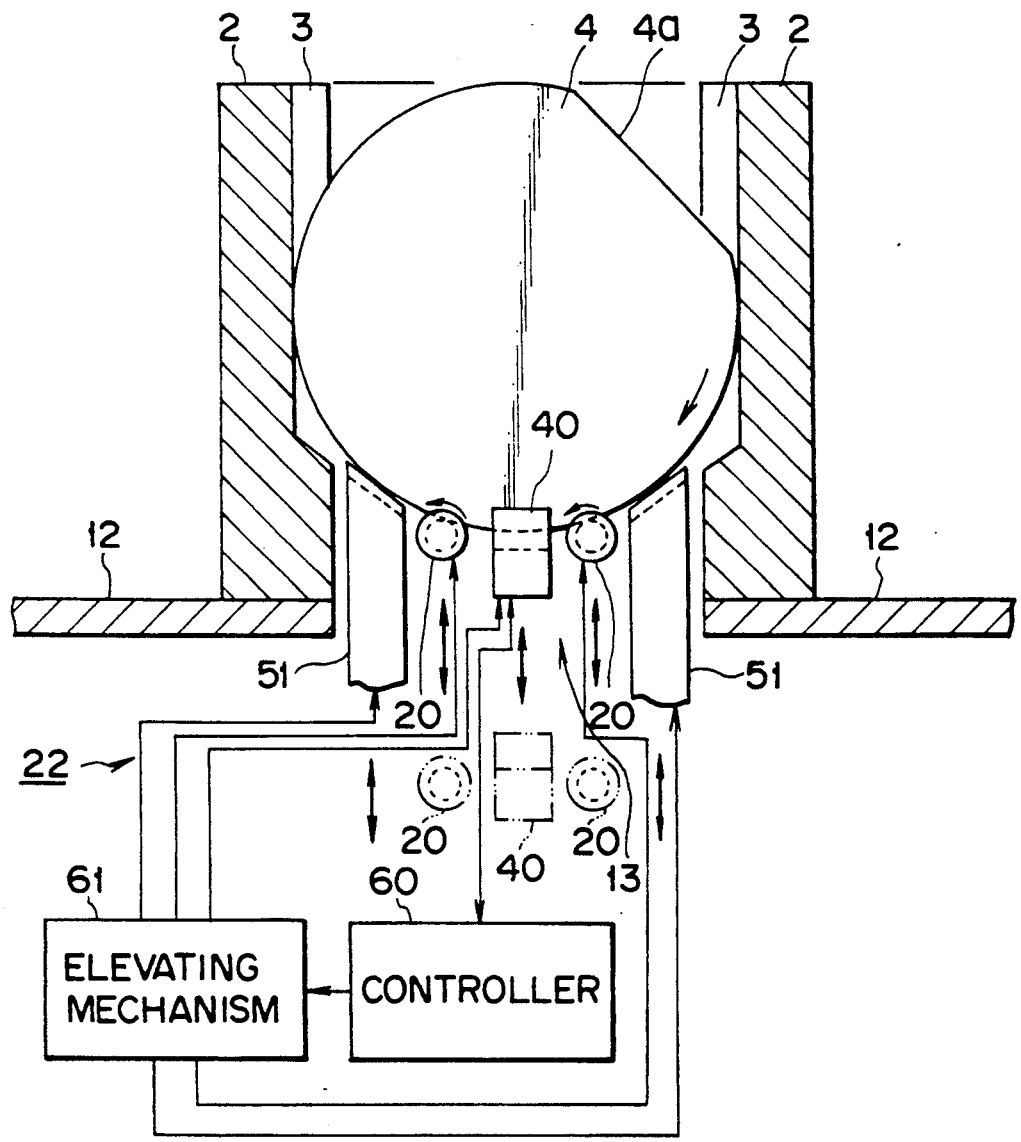
F I G. 2

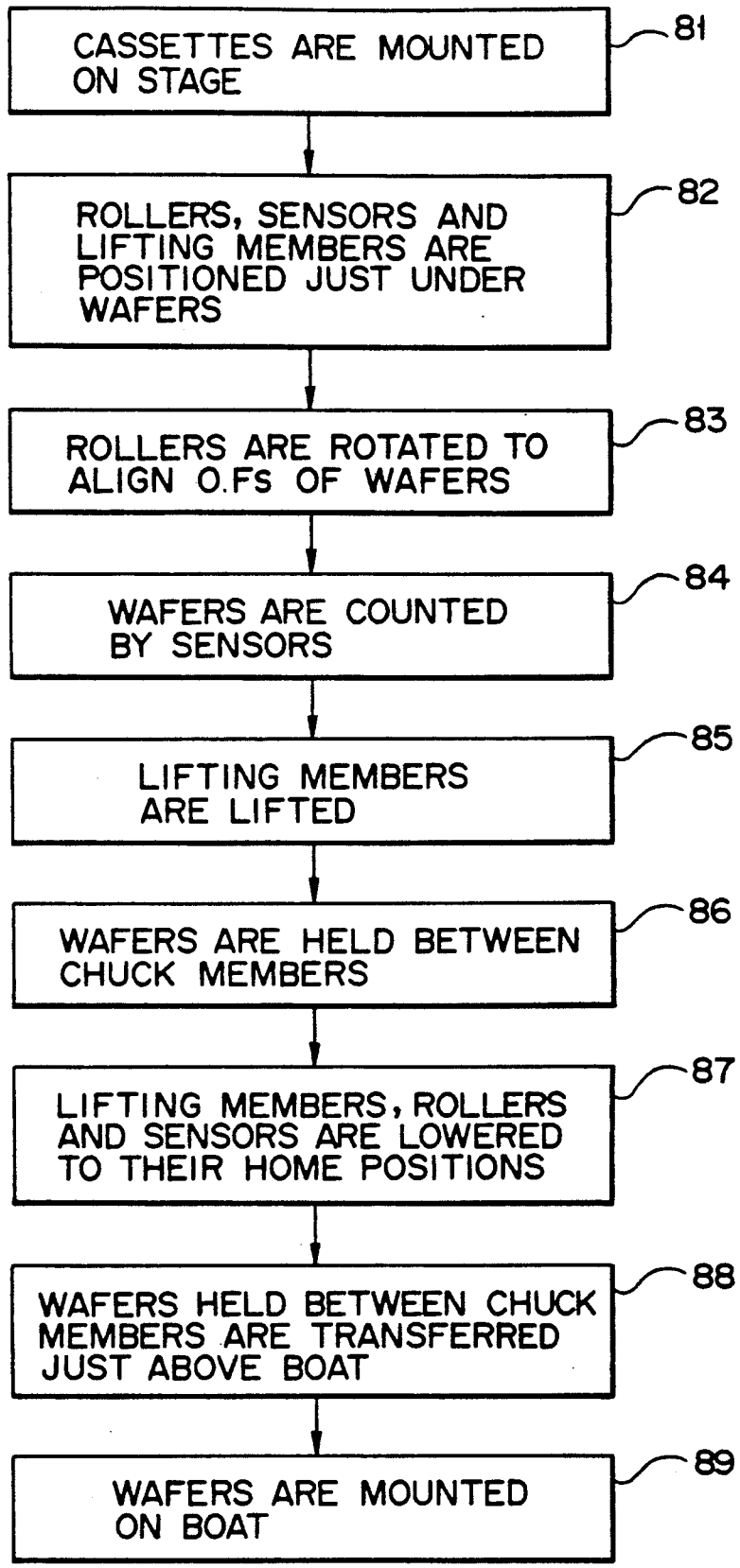
F I G. 8

WAFER COUNTER HAVING DEVICE FOR ALIGNING WAFERS

BACKGROUND OF THE INVENTION

1. Field of the Invention

The present invention relates to a wafer counter device serving to count the number of wafers in a cassette and align the orientation flats (which will be hereinafter referred to as O.F. or orifla) of the wafers.

2. Description of the Related Art

Wafer counter is used at various lots in the course of manufacturing semiconductor devices so as to confirm the presence of the semiconductor wafers in a cassette and the number of the wafers in the cassette, particularly when batch heat-treating of plural wafers, which will be supplied to a device at a next process. In short, the wafer counter serve to detect the number of the wafers in cassette. The wafer counter of this type is disclosed in the Japanese Utility Model Disclosure Sho 61-129340.

On the other hand, the Japanese Patent Publication Hei 1-59739 discloses a technique for aligning the oriflas of plural semiconductor wafers in a cassette with one another by rotating rollers. According to this technique, however, each of the wafers in grooves of the cassette is contacted with the inner wall at upper and lower portions of the groove when it is rotated by the rotating rollers. This causes the wafers to be cracked at their contact surfaces and film bonded to them according to the CVD process to be peeled off from them. Namely, a large amount of the so-called chippings is thus caused. As the result, particles created by the chippings float in the air and adhere to the wafers, thereby decreasing the productivity of the semiconductor devices.

The Japanese Patent Disclosures Sho 63-13344 and 64-743 disclose a technique for detecting the presence of plural wafers in a cassette at once, using the same number of optical position detectors as that of the wafers per cassette.

When the number of the wafers in a cassette is to be counted after the oriflas aligning process according to the techniques disclosed in the above-cited references, each of the wafers rotated by the rotating rollers which serve to align the oriflas of the wafers with one another is moved range of 2 mm, maximum, from the center of that groove of the cassette, in which the wafer is seated, in direction of the thickness of the wafer.

The pitch of grooves on the inner wall of the cassette which is usually used is 3/16 inches (4.76 mm) and the interval between the two adjacent wafers in the cassette is represented by this pitch of grooves. If the optical position detector can be made as thin as possible to be inserted into the interval between the two adjacent wafers in the cassette and the possible thickness of it is 2 mm, for example, the distance between the wafer and the optical position detector inserted is only about 1 mm.

When each of the optical position detectors is moved under this state to insert it between the two adjacent wafers in the cassette, the wafers which may be greatly shifted from the centers of their grooves of the cassette are contacted with the optical position detector at their peripheral portions. As the result, a large amount of the chippings is created from the wafers thus contacted, thereby decreasing the productivity of semiconductor devices.

Further, the oriflas of the wafers in a cassette are aligned with one another by the aligning means and the wafers in the cassette are then counted by the wafer counter at a different process in the conventional cases. Therefore, it takes a long time to process a lot of the wafers. This is the reason why it is desired to further enhance the throughput.

SUMMARY OF THE INVENTION

The present invention is therefore intended to eliminate the above-mentioned drawbacks.

Accordingly, an object of the present invention is to provide a wafer counter capable of keeping certain the positions of rotating rollers with which plural wafers in a cassette are contacted, when the oriflas of the wafers in the cassette are to be aligned with one another, so as to reduce the chippings of the wafers in the cassette.

Another object of the present invention is to provide a wafer counter capable of enhancing the throughput and the productivity of semiconductor devices.

According to an aspect of the present invention, there can be provided a wafer counter device comprising aligning means for aligning the orientation flats of plural wafers in a cassette with one another; and counting means having a non-contact type sensor, for detecting whether or not the wafers are present in the cassette and for serving to count the number of the wafers in the cassette on the basis of the result obtained by having detected in non-contact manner by sensor; wherein said aligning means includes an aligning roller in contact with peripheral portions of the wafers, respectively, to rotate the wafers and a means for rotating the aligning roller.

The outer circumference of each of the aligning rollers may be formed on around smooth or provided with grooves.

When the wafers are rotated in a cassette by the aligning rollers which are provided with the ring-shaped grooves on the outer circumference thereof, each of the wafers can be prevented from moving in its thickness direction because its lower portion is seated in the grooves on the aligning rollers. Further, each of the wafers can be contacted only with a part of the bottom of each of the grooves on the rollers. Still further, the angle by which the wafers are tilted can be made smaller. Therefore, the chippings of the wafers caused when the wafers are rotated in the cassette and contacted with the cassette can be reduced to a greater extent. Even when each of non-contact type sensors is moved to insert it between the two adjacent wafers in the cassette, it can be prevented from contacting the wafers, thereby reducing the amount of dusts created to a greater extent.

The number of the aligning rollers used may be at least one but it is more preferable that two of them are arranged parallel to each other.

It is also preferable that the sensors of the noncontact type are located between the paired aligning rollers.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

FIGS. 2 and 3 are cross sectional views schematically showing the main portion of a wafers aligning device;

FIG. 8 is a flow chart intended to explain the wafers transfer process in which wafers are counted and their orientation flats are aligned with one another.

DETAILED DESCRIPTION OF THE PREFERRED EMBODIMENTS

Figure 1:
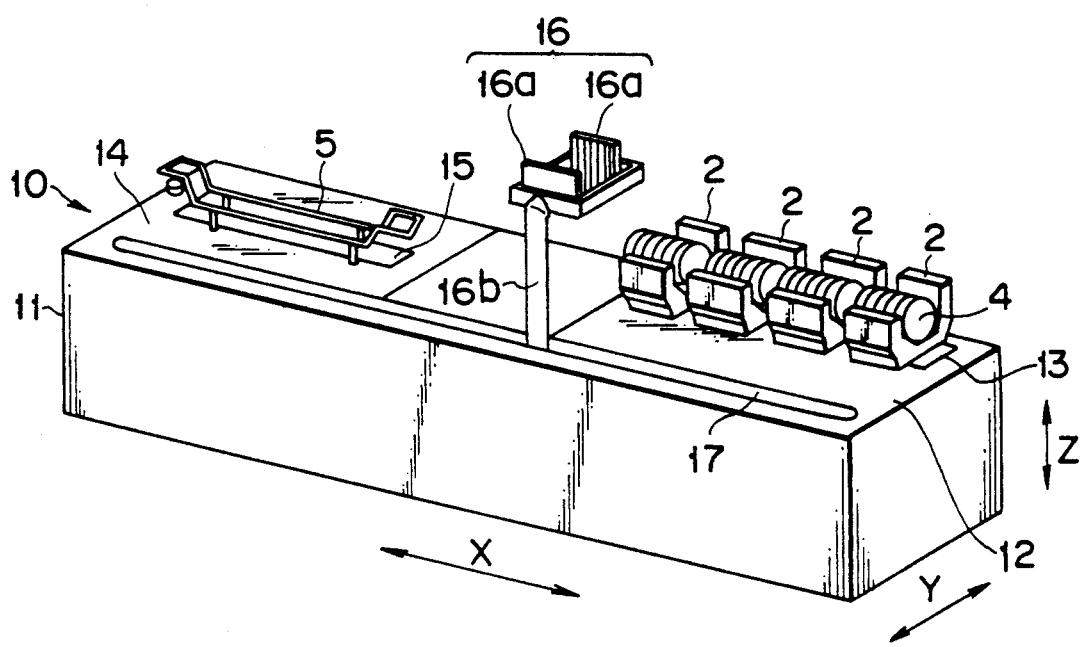
FIG. 1 is a perspective view schematically showing the whole of the wafer transfer apparatus.

An embodiment of the present invention will be described with reference to the accompanying drawings.

A wafer transfer apparatus 10 is located in front of a CVD apparatus (not shown) and plural semiconductor wafers 4 are transferred, as a set, from a cassette 2 on a stage 12 to a boat 5 on a stage 14 of the apparatus 10.

As shown in FIG. 1, the upper portion of the apparatus 10 is included two stages, one of which serves as a cassettes stage 12 and the other of which serves as a boat stage 14. Plurality of wafer cassettes 2 are mounted in an array of series on the cassettes stage 12. An opening 13 is formed at the top of the cassettes stage 12, locating just under the array of cassettes 2 on the stage 12. A lifting device (not shown) and a wafer counter 22 are housed in a body 11 which is located on the side of the cassettes stage 12.

When the cassettes 2 are kept mounted on the stage 12, bottom openings of the cassettes 2 are communicated with the opening 13, thereby allowing the lifting members 51 and members 20, 40 of the wafer counter 22 to be inserted from below into each of the cassettes 2 through the opening 13.

Each of the cassettes 2 houses twenty five sheets of 6 inch (or outer diameter of 150 mm) semiconductor wafers 4 therein. Each of the wafers 4 has an orientation flat (or O.F.) 4a and the orientation of each of the wafers 4 can be confirmed by its O.F. 4a. The length of this O.F. 4a is about 60 mm.

The cassette 2 is made of soft resin such as fluororine resin and a plurality of grooves 3 are formed on the inner wall of the cassette 2. These grooves 3 serve to hold the wafers 4 vertical when the cassette 2 is mounted on the cassettes stage 12, directing its opening downward.

On the other hand, another opening 15 is formed at the top of the boat stage 14 and the wafer boat 5 is mounted on the boat stage 14, such as striding over the opening 15. A lifting device (not shown) is housed in that section of the body 11 which is located on the side of the boat stage 14.

A further elongated opening 17 is formed at the top of the apparatus 10, extending from the cassettes stage 12 to the boat stage 14. A vertical shaft 16b of a chuck device 16 is projected upward through the opening 17. A carriage device (not shown) is located in the body 11 and the chuck device 16 is moved in the longitudinal direction (or in a direction X) of the transfer device 10 by the carriage device. The chuck device 16 has a pair of chuck members 16a. Those faces of the chuck members 16a are opposed to each other. Grooves are formed at a same pitch on the wafer holding faces of the members 16a. The vertical shaft 16b of the chuck device 16 is moved up and down in a direction Z by an elevating mechanism (not shown). The paired chuck members 16a are moved to and from each other in a direction Y by an internal transmission mechanism (not shown).

A wafer counter 22 provided with a wafers aligning system will be described referring to FIGS. 2 through 5.

Figure 3:
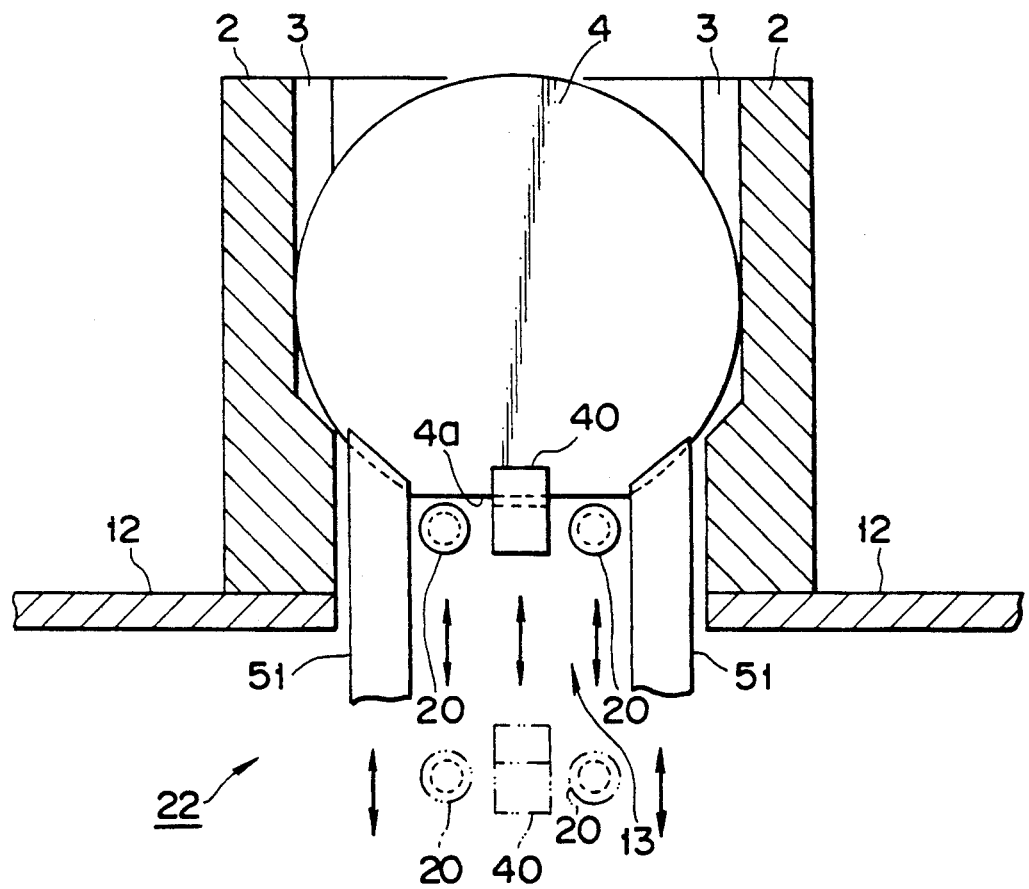

As shown in FIGS. 2 and 3, a optical detector 40 and a pair of aligning rollers 20 are arranged to enter into and come out the cassette 2 through the opening 13 of the cassettes stage 12. The detector 40 and the paired aligning rollers 20 are attached to a same unit (not shown) and moved up and down at once by an elevating mechanism 61.

A pair of lifting members 51 are arranged, both side of the unit, to which the detector 40 and the rollers 20 are attached, between them. The lifting members 51 are connected to a drive section of the elevating mechanism 61, thereby allowing them to be moved up and down, independently of the unit of the detector 40 and the rollers 20.

Figure 4:
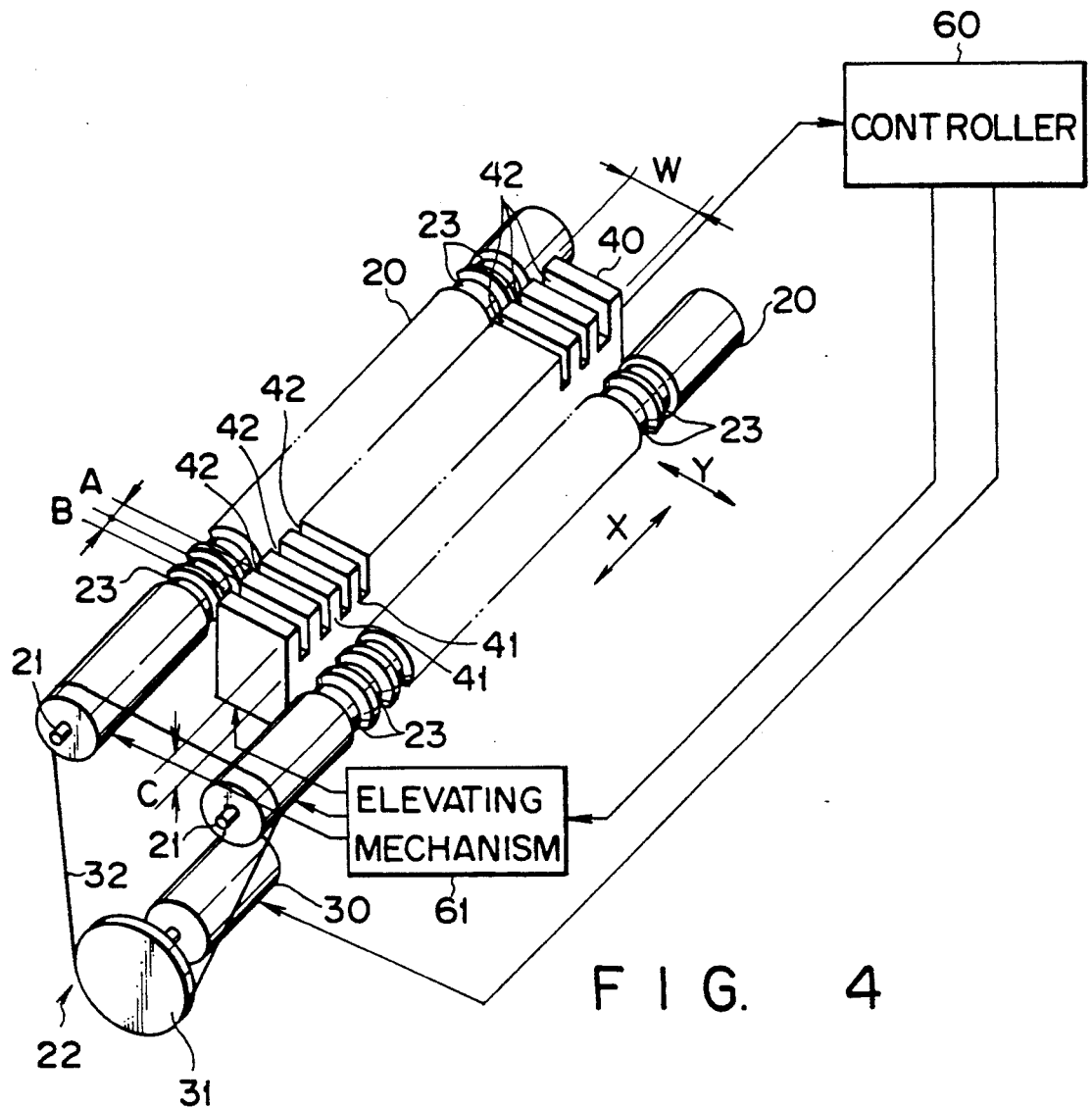
FIG. 4 is a perspective view showing the main portion of the wafers aligning device.

As shown in FIG. 4, the two rollers 20 are arranged horizontal and parallel or substantially parallel to each other, with a certain interval interposed between them. Ring-shaped grooves 23 in which peripheral portions of the wafers 4 can be seated are formed plural or at an interval at which 25 sheets of the wafers are housed in the cassette on the outer circumference of each of the rollers 20. Each of the rollers 20 has a diameter of about 20 mm and it is made of soft resin such as fluororine resin. These rollers 20 functions to rotate a array of the wafers 4 which are contacted with them and align the oriflas 4a of the wafers 4 with one another at the same time.

Each of the rollers 20 is made rotatable round its support shaft 21. More specifically, a motor 30 having a pulley 31 is located below the two rollers 20 and a belt 32 is stretched round the pulley 31 and the two rollers 20.

The interval between the two rollers 20 can be adjusted depending upon the size of the wafers 4 and the length of the O.F. 4a. This interval is set in such a way that the two rollers 20 are contacted with the orifla 4a of each of the wafers 4 when the wafers 4 are aligned with one another at their oriflas 4a. When the size of the wafers is changed, therefore, the interval between the two rollers 20 can be unchanged.

The optical detector 40 is located between the two rollers 20 and the top of the detector 40 is made parallel to a plane or approximate plane formed by the two rollers 20. This detector 40 is made by injection-molding ceramic or resin such as Derlin (registered trade mark of polyacetals) and these materials are selected as having such a characteristic that can prevent from generating particles from being caused when the detector 40 is vibrated.

Figure 7:
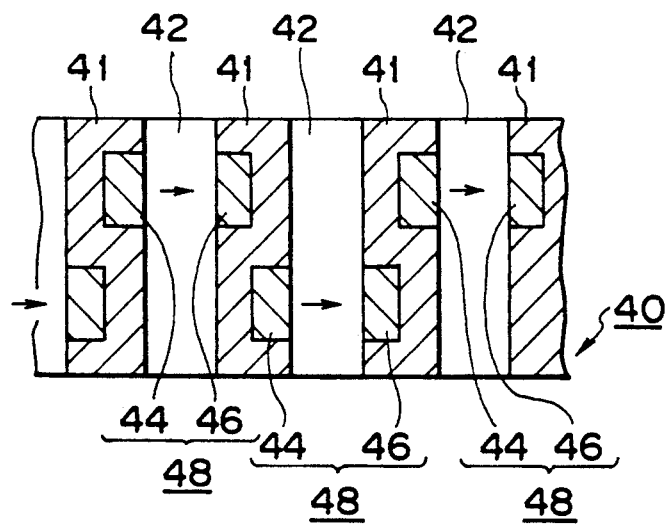
FIG. 7 is a horizontally-sectioned view showing a part of the optical detector.

A plurality of grooves 42 formed on the top of the detector 40 are arranged to correspond to those 23 on the outer circumferences of the rollers 20. As shown in FIG. 7, a non-contacted type sensor 48 comprises light emitting and receiving elements 44 and 46 which are embedded in opposed inner vertical walls of each of the grooves 42. It is more preferable that those portions of each of the rollers 20 which are contacted with the wafers 4 are made of plastic. It is desirable that these portions of each of the rollers 20 have such an elasticity that is none or small recessed by the load of the wafers 4 seated on them.

The pitch of the grooves 42 on the top of the wafers detector 40 is made equal to that (3/16 inches=about 4.7 mm) of the grooves on the inner face of the wafer cassette 2, the width A of each of the grooves 42 is about 2.7 mm and the thickness B of a partition wall 41 between the adjacent grooves 42 is 2 mm.

Since the thickness B of this partition wall 41 is 2 mm, it is impossible to embed the light emitting element 44 and receiving element 46 back to back with each other in the partition wall 41. As shown in FIG. 7, therefore, the sensors 48 are shifted from their adjacent ones in the partition wall 41.

The detector 40 is located between the two rollers 20. The width W of the detector 40 is thus made to be 15 mm, for example, smaller than the length of the orifla 4a although it depends upon the size of the wafers 4 used. Further, the thickness B of the partition wall 41 is 2 mm and it is therefore difficult to make the depth C of the groove 42 larger than 5 mm, considering the mechanical strength of the partition wall 41 made of Derlin and its deformation caused after the detector 40 is injection-molded and as time goes by. The depth C of each of the grooves 42 is thus set 5 mm, the upper limit, in this embodiment of the present invention. It is therefore desirable in order to accurately detect the wafers 4 that the oriflas 4a which have been aligned with one another are fitted into the grooves 42 on the detector 40.

Figure 6:
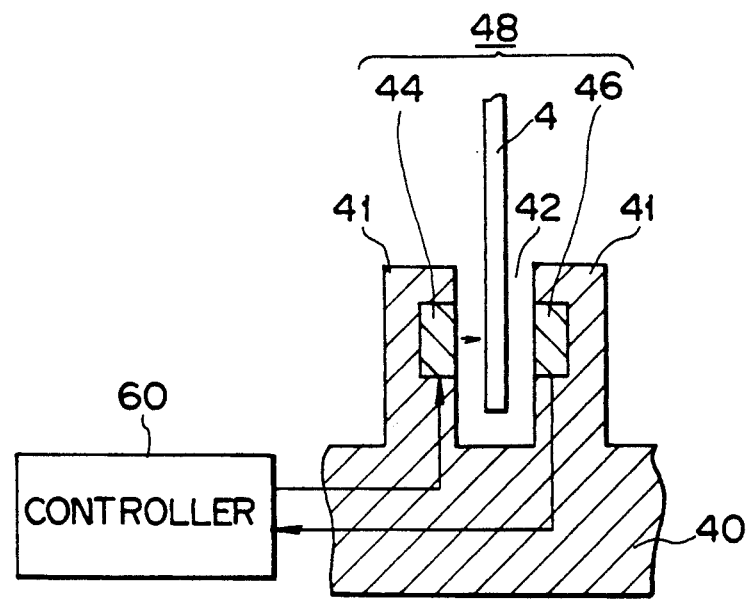
FIG. 6 is a vertically-sectioned view showing a part of each of the wafer and an optical detector.

As shown in FIG. 6, the optical elements 44 and 46 are embedded in the opposed adjacent partition walls 41 and the presence of the wafers 4 in the cassette 2 can be detected while inserting the edge portion of each of the wafers 4 into each of the grooves 42. Each of the sensors 48 comprises, as described above, one set of the light emitting element 4 and the light receiving elements 46 which has the photoelectrically converting function. These elements 44 and 46 form an optical coupler and they are connected to a controller 60.

As shown in FIG. 7, the light emitting element 44 of on sensor 48 is embedded back to back with the light receiving element 46 of its adjacent sensor 48 but shifted from the latter in the partition wall 41.

Referring to FIG. 8, it will be described how the oriflas 4a of the plural wafers 4 are aligned with one another and how the presence of these wafers 4 in the cassette 2 is detected by the above-described embodiment of the present invention.

[I] Plural cassettes 2 are mounted on the stage 12 of the apparatus 10 (step 81). The aligning rollers 20, the detector 40 and the lifting members 51 are now made ready at their home positions under the cassette 2.

When it is detected that the cassette 2 has been mounted on the stage 12, the rollers 20, the detector 40 and the lifting members 51 are lifted and positioned right under the wafers 4 in the cassette 2 (step 82).

Figure 5:
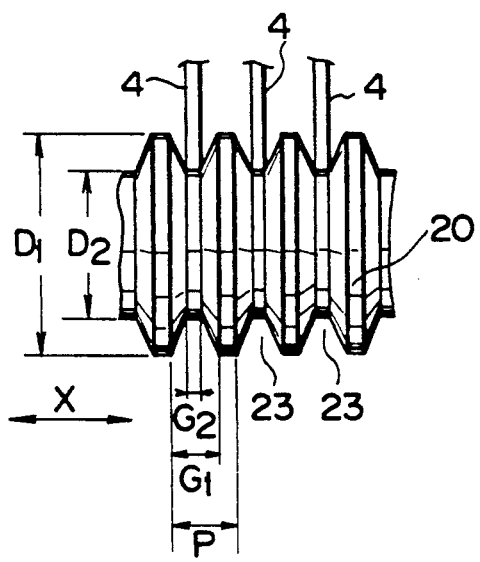
FIG. 5 is an enlarged view showing a part of a roller which serves to align orientation flats of wafers.

As shown in FIG. 2, the peripheral portions of the wafers 4 enter into the grooves 23 on each of the rollers 20 and the wafers 4 are a little lifted in their cassette 2 by the rollers 20. As shown in FIG. 5, each of the wafers 4 is thus positioned in the direction X by the grooves 23 of the rollers 20. The wafers 4 are still left not contacted with the partition wall 41 of the detector 40 and the lifting members 51. As shown in FIG. 2, each of the wafers 4 is contacted with the inner wall of the cassette 2 at two points under this state.

[II] Signal is applied from the controller 60 to the motor 30 to rotate the motor 30 at a certain speed. The rotation force of the motor 30 is transmitted to the paired rollers 20 by the belt 32, thereby causing the rollers 20 to be rotated in a same direction. The rollers 20 are rotated forward by an angle of 180°, and then their may be rotated backward by an angle of 180°. Their rotating speed is selected so high as without generate chipping at the peripheral portions of the wafers 4.

Each of the wafers 4 is rotated in the grooves 23 by the rollers 20 until its orifla 4a is positioned downward.

As shown in FIG. 3, when the oriflas 4a of the wafers 4 are positioned downward, the wafers 4 are released from the rollers 20 and now supported by the paired lifting members 51, while automatically stopping their rotation but keeping their oriflas 4a positioned downward (step 83).

As shown in FIG. 5, since each of the wafers 4 or its peripheral portion except its orifla 4a has been accurately positioned by the grooves 23 of the rollers 20, their peripheral portions can be kept not contacted with the grooves 42 of the detector 40. This enables their oriflas 4a to be aligned with one another while keeping their peripheral portions not contacted with the partition walls 41 of the detector 40, thereby preventing them from being damaged and dust from being created. Namely, each of the grooves 42 of the detector 40 is selected to have such a relation to the wafer 4 or a depth that can prevent the rotating wafer from being contacted with the bottom of the groove 42.

[III] The number of the wafers 4 in the cassette 2 is counted by the detector 40 while the oriflas alignment is being conducted (step 84). In a case where the aligning of the oriflas 4a and the detecting of the wafers 4 are conducted at the same time and where an integral structure is provided to conduct these two processes at the same time, the time needed to process the wafers 4 can be reduced by such a time length that is needed to finish one process. This contributes greatly to enhancing the productivity and the through-put and to saving the space of the high grade clean room. Efficient use of the small clean room is quite important particularly in the course of manufacturing ultra-large scale integrated circuits.

As shown in FIG. 6, when radiated light is emitted from the light-emitting element 44, it is shielded by the wafer 4 and electric signal which is proportional to the amount of the light received by the light-receiving element 46 is applied to the controller 60. All of the wafers 4 in the cassette 2 are thus detected and the number of them can be grasped. When the light emitted from the light-receiving element 46 is frequency-, pulse- and wavelength-modulated in order to enhance the detection accuracy of the wafers, it can be selectively received by the light receiving system to thereby increase the S/N ratio of the light thus received and ambient light.

When the wafers 4 further change their posture due to the rotating rollers 20 and their oriflas 4a are positioned downward, the amount of the radiated light shielded by each of the wafers 4 changes. The oriflas 4a of the wafers 4 are thus detected. When it is detected that the oriflas 4a of all wafers 4 in the cassette 2 are aligned with one another, the rotation of the motor 30 is stopped by signal as applied from the controller 60 to the motor 30.

It is detected at an instant in this manner whether or not the wafers 4 are present in all of the grooves 42 and how they posture in the grooves 42, and signal is applied from the controller 60 to a device (not shown) at a next process and display is further made on a motor device (not shown).

Figure 9A:
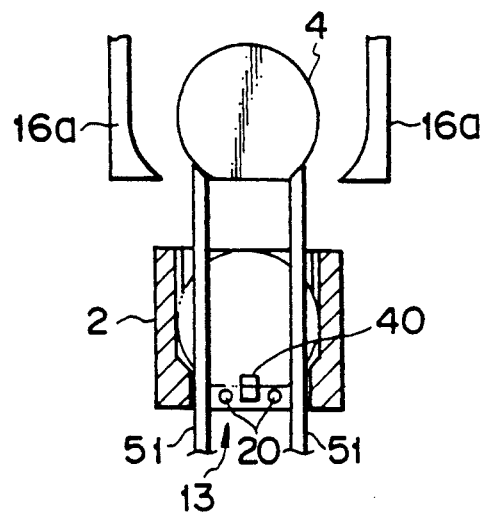
FIGS. 9A through 9C are intended to explain the operation of transferring wafers from a cassette to a boat.

[IV] As shown in FIG. 9A, the lifting members 51 are lifted to lift all of the wafers 4 above the cassette 2 (step 85). When the wafers 4 are lifted to the same level as that of the chuck members 16a, the lifting members 51 are stopped. All of the wafers 4 are once held by the chuck members 16a (step 86).

[V] The rollers 20 and the detector 40 are lowered while lowering the lifting members 51 and all of them are thus returned to their home positions (step 87). The rollers 20 and the detector 40 may be lowered at the same time while lowering the lifting members 51, or after the lifting members 51 are lowered.

Figure 9B:
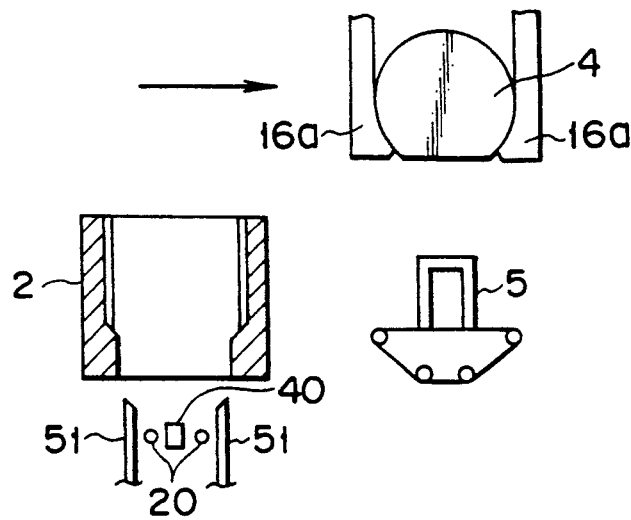

[VI] As shown in FIG. 9B, the wafers 4 held by the chuck members 16a are carried just above the boat 5 (step 88).

Figure 9C:
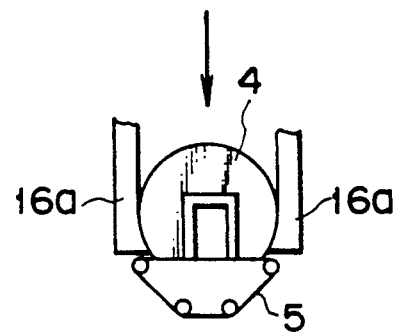

As shown in FIG. 9C, the chuck members 61 are then lowered to mount the wafers on the boat 5 (step 89). The boat 5 is then carried to the CVD apparatus (not shown) by the boat conveying apparatus (not shown).

According to the above-described embodiment of the present invention, the oriflas alignment and wafers count can be achieved by the same device and this enables the throughput to be increased to a greater extent at the process of manufacturing semiconductor devices.

Further, the wafers 4 can be kept less contacted with their cassette 2 and the angle by which the wafers are tilted in their cassette 2 can be made smaller at the time when their oriflas 4a are aligned with one another. Therefore, chipping is almost never caused at the rim portion of each of the wafers 4.

Still further, the wafers 4 can be guided at a desired pitch in the grooves 23 of the rollers 20 and they can be kept not contacted with the detector 40 while being rotated by the rollers 20. Therefore, the wafers 4 can be made free from any damage caused when they are contacted with the detector 40. In addition, the creation of dust and the chipping of the wafers can be efficiently prevented.

The above-described wafer counter according to one embodiment of the present invention is not used only by the CVD apparatus of the vertical or horizontal type but it ca be variously used in the course of manufacturing semiconductor devices. Namely, it can be applied to the heat processing apparatus, etching apparatus, ion inplanter, testing device, resist coating device and wafer cassette stocker, for example.

Although the wafers 4 have been aligned with one another, positioning their oriflas 4a downward, in the above-described embodiment of the present invention, they may be aligned, directing their oriflas 4a upward. Namely, one of the two rollers 20 is contacted with the peripheral portions of the wafers 4. The roller is lifted to a certain level higher than the position at which the two rollers 20 were kept to align the wafers 4 with one another, positioning their oriflas 4a downward, and it is then rotated to align the wafers 4 with one another, positioning their oriflas 4a upward.

Although the paired sensor elements 48 have been of the transmission type, they are not limited to this type but may be of the reflector type.

The light-emitting diode can also be used as the light-emitting element 44 and the photo-diode, phototransistor and thin optical detector of the solar cell type, for example, may be used as the light-receiving element 46.

Further, the number of the rollers 20 used to the oriflas of the wafers with one another is not limited to two but it may be only one or more than three.

The detector 40 may be attached at least to one of the paired lifting members 51.

According to the above-described device of the present invention, the oriflas of the plural wafers can be aligned with one another while counting the number of the wafers in the cassette. This enables the throughput to be increased to a greater extent in the course of manufacturing the semiconductor devices.

Further, the plural wafers can be kept not contacted with the wafers detector when the oriflas of them are being aligned with one another. This enables the chipping to be almost never caused at the peripheral portions of the wafers and damage added to the wafers to be reduced to a greater extent.

Still further, the amount of dust created can be reduced to a greater extent, as compared with the conventional devices, at the time when the number of the wafers is counted while aligning the oriflas of them with one another. This enables the clean room to have a certain cleanness and the productivity of the semiconductor devices to be further enhanced.

Additional advantages and modifications will readily occur to those skilled in the art. Therefore, the invention in its broader aspects is not limited to the specific details, and representative devices shown and described herein. Accordingly, various modifications may be made without departing from the spirit or scope of the general inventive concept as defined by the appended claims and their equivalents.

What is claimed is:

1. A wafer counter device for counting wafers having orientation flats denoting an orientation of said wafer, comprising:

wafer aligning means for aligning orientation flats of a plurality of aligned wafers with one another; and counting means having a non-contact type sensor for detecting the aligned wafers, said counting means counting the number of wafers based on a result of a non-contact detection of the aligned wafers performed by said non-contact type sensor;

wherein said wafer aligning means comprises a pair of aligning rollers disposed in parallel to abut against a periphery of a wafer to rotate said wafer, and rotating means for rotating said aligning rollers, wherein an annular groove is formed in a portion of each of said aligning rollers which abuts against the periphery of the wafer.

2. The wafer counter device according to claim 1, wherein the non-contact type sensor is located between the two aligning rollers.

3. The wafer counter device according to claim 1, wherein the non-contact type sensor is of the optical type comprising a combination of light-emitting and receiving elements.

4. The wafer counting device according to claim 1, further comprising means for lifting said aligning rollers, and means for controlling said means for rotating the aligning rollers and said means for lifting said aligning rollers.

5. The wafer counting device according to claim 1, further comprising means for vertically moving said pair of aligning rollers and wafer counting means together.

6. The wafer counting device according to claim 1, wherein said rotating means permits rotating said pair of aligning rollers at the same speed and in the same direction.

7. A wafer counter device for counting wafers having orientation flats denoting an orientation of said wafer, comprising:

wafer aligning means for aligning orientation flats of a plurality of aligned wafers with one another; and counting means having a non-contact type sensor for detecting the aligned wafers, said counting means counting the number of wafers based on a result of a non-contact detection of the aligned wafers performed by said non-contact type sensor;

wherein said wafer aligning means comprises a pair of aligning rollers disposed in parallel to abut against a periphery of a wafer to rotate said wafer, and rotating means for rotating said aligning rollers, wherein an annular groove is formed in a portion of each of said aligning rollers which abuts against the periphery of the wafer;

and wherein said aligning rollers are disposed on both sides of said wafer counting means; and said wafer counting device further comprising means provided with a pair of lift members for pushing wafers upward, said lift members being mounted on both sides of said pair of aligning rollers.

8. The wafer counting device according to claim 7, wherein said lift members are vertically moved independently of said aligning rollers.

9. A wafer counter device for counting wafers having orientation flats denoting an orientation of said wafer, comprising:

wafer aligning means for aligning orientation flats of a plurality of aligned wafers with one another; and counting means having a non-contact type sensor for detecting the aligned wafers, said counting means counting the number of wafers based on a result of a non-contact detection of the aligned wafers performed by said non-contact type sensor;

wherein said wafer aligning means comprises a pair of aligning rollers disposed in parallel to abut against a periphery of a wafer to rotate said wafer, and rotating means for rotating said aligning rollers, wherein an annular groove is formed in a portion of each of said aligning rollers which abuts against the periphery of the wafer; and wherein an edge surface of the periphery of said wafer abuts against a bottom surface of said annular groove.

* * * * *